(12) United States Patent
Kaimori et al.

(10) Patent No.: US 9,343,653 B2
(45) Date of Patent: May 17, 2016

(54) PIEZOELECTRIC ELEMENT INCLUDING FLUORORESIN FILM

(71) Applicants:Sumitomo Electric Industries, Ltd., Osaka-shi, Osaka (JP); A SCHOOL CORPORATION KANSAI UNIVERSITY, Suita-shi, Osaka (JP)

(72) Inventors: Shingo Kaimori, Osaka (JP); Jun Sugawara, Osaka (JP); Yoshiro Tajitsu, Suita (JP)

(73) Assignees: SUMITOMO ELECTRIC INDUSTRIES, LTD., Osaka-Shi (JP); A SCHOOL CORPORATION KANSAI UNIVERSITY, Osaka (JP)

( * ) Notice: Subject to any disclaimer, the term of this patent is extended or adjusted under 35 U.S.C. 154(b) by 90 days.

(21) Appl. No.: 14/376,812

(22) PCT Filed: Jan. 28, 2013

(86) PCT No.: PCT/JP2013/051721
§ 371 (c)(1),
(2) Date: Aug. 5, 2014

(87) PCT Pub. No.: WO2013/118598
PCT Pub. Date: Aug. 15, 2013

(65) Prior Publication Data
US 2015/0015120 A1    Jan. 15, 2015

(30) Foreign Application Priority Data
Feb. 7, 2012    (JP) ................................ 2012-024542

(51) Int. Cl.
*H01L 41/09*    (2006.01)
*H01L 41/193*    (2006.01)
(Continued)

(52) U.S. Cl.
CPC ................ *H01L 41/193* (2013.01); *B32B 7/02* (2013.01); *B32B 7/12* (2013.01); *B32B 27/08* (2013.01);
(Continued)

(58) Field of Classification Search
CPC ..................................................... H01L 41/193
USPC ........................................................... 310/328
See application file for complete search history.

(56) References Cited

U.S. PATENT DOCUMENTS 4,654,546 A    3/1987    Kirjavainen
5,696,207 A *  12/1997   Vargo ..................... B82Y 30/00
                                                  525/326.2
(Continued)

FOREIGN PATENT DOCUMENTS

JP    60-055034 A    3/1985
JP    06-342947 A    12/1994
(Continued)

OTHER PUBLICATIONS

Zhukov et al., "Polarization hysteresis and piezoelectricity in open-porous fluoropolymer sandwiches," J. Appl. Phys., 2007, vol. 102, 6 pages.
(Continued)

*Primary Examiner* — J. San Martin
(74) *Attorney, Agent, or Firm* — Ditthavong & Steiner, P.C.

(57) ABSTRACT

There is provided a piezoelectric element, including: a porous fluororesin film made of a first fluororesin; and a nonporous fluororesin layer stacked on at least one surface of the porous fluororesin film and made of a second fluororesin, wherein the first fluororesin is different in type from the second fluororesin, and when 50 pores are selected in descending order from a pore having the longest thickness-direction length, of pores present in a cut surface of the porous fluororesin film in a thickness direction, an average value $A_{50}$ of thickness-direction lengths of the 50 pores is 3 μm or smaller.

11 Claims, 6 Drawing Sheets

(51) Int. Cl.
*H01L 41/45* (2013.01)
*H01L 41/113* (2006.01)
*H01L 41/257* (2013.01)
*C08J 9/36* (2006.01)
*B32B 7/02* (2006.01)
*B32B 7/12* (2006.01)
*B32B 27/08* (2006.01)
*B32B 27/32* (2006.01)

(52) U.S. Cl.
CPC .............. *B32B 27/322* (2013.01); *C08J 9/365* (2013.01); *H01L 41/1132* (2013.01); *H01L 41/257* (2013.01); *H01L 41/45* (2013.01); *B32B 2307/20* (2013.01); *B32B 2307/306* (2013.01); *B32B 2307/412* (2013.01); *B32B 2457/00* (2013.01); *C08J 2327/18* (2013.01); *C08J 2429/10* (2013.01); *Y10T 428/249975* (2015.04)

(56) References Cited

U.S. PATENT DOCUMENTS

| 2008/0203619 | A1 | | 8/2008 | Lanceros-Mendez et al. |
| 2010/0112055 | A1 | * | 5/2010 | Lin ..................... A61K 9/0004 424/473 |
| 2010/0203310 | A1 | | 8/2010 | Hayashi et al. |
| 2015/0295163 | A1 | * | 10/2015 | Komeda ................. H01G 7/02 428/212 |

FOREIGN PATENT DOCUMENTS

| JP | 2007231077 | A | * | 9/2007 | |
| JP | 2009501826 | A | | 1/2009 | |
| JP | 2010186960 | A | | 8/2010 | |
| JP | 2011018897 | A | | 1/2011 | |
| JP | 2011132390 | A | * | 7/2011 | |
| JP | 2011-210865 | A | | 10/2011 | |
| JP | 2012-164735 | A | | 8/2012 | |
| JP | 2012-209498 | A | | 10/2012 | |
| JP | 2013162051 | A | * | 8/2013 | |
| WO | 2008018400 | A1 | | 2/2008 | |
| WO | WO 2010143687 | A1 | * | 12/2010 | ............. H01L 37/02 |
| WO | WO 2013129142 | A1 | * | 9/2013 | ................. C08J 9/32 |

OTHER PUBLICATIONS

Neugschwandtner et al., "Large piezoelectric effects in charged, heterogeneous fluoropolymer electrets", Applied physics. A, Materials science and processing, 2000, vol. 70, Part 1, pp. 1-4.

Hu et al., "Breakdown-induced polarization buildup in porous fluoropolymer sandwiches: a thermally stable piezoelectret", Journal of Applied Physics, 2006, vol. 99, 5 pages.

Japanese Office Action for related Japanese Patent Application No. 2012-024542 dated Mar. 9, 2015, with English-language Summary, 12 pages.

International Search Report for corresponding International Application No. PCT/JP2013/051721, mail date Apr. 23, 2013, 1 page.

Emfit Ltd., "Emfit Ferro-Electret Film", http://www.emfit.com/en/sensors/products_sensors/emfit-film/, 1 page (Cited in Specification).

Euro Protech Ltd., 2007-2008, http://www.europrotech.com/Euro/trade/t_emfit2.html (Partial English Translation included), 6 pages (Cited in Specification).

Masatoshi Nakayama et al., "Piezoelectricity of Ferroelectret Porous Polyethylene Thin Film", Japanese Journal of Applied Physics 48, 2009, 4 pages (Cited in Specification).

Chinese Office Action for related Chinese Patent Application No. 201380008202.4 dated Mar. 2, 2016, 17 Pages.

Wang et al., "Electret properties for hybrid films composed of porous PTFE and P(VDF-HFP) film", Journal of Functional Materials Contents, Sep. 1, 2004, vol. 35, pp. 1349-1351 with English Abstract.

Zhang et al., "Piezoelectricity of laminated polymer films made of nonporous fluoroethylene and porous polytetrafluoroethylene layers", Chinese Journal of Physics, May 15, 2009, vol. 58, No. 5, pp. 3525-3531 with English Abstract.

* cited by examiner

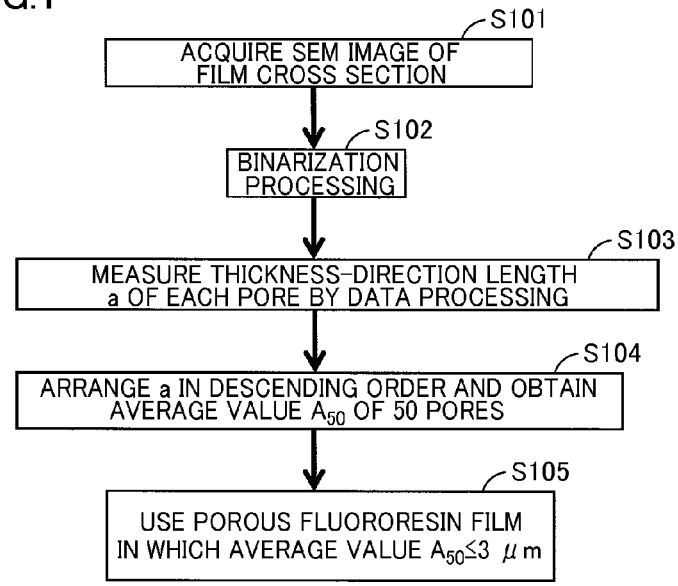
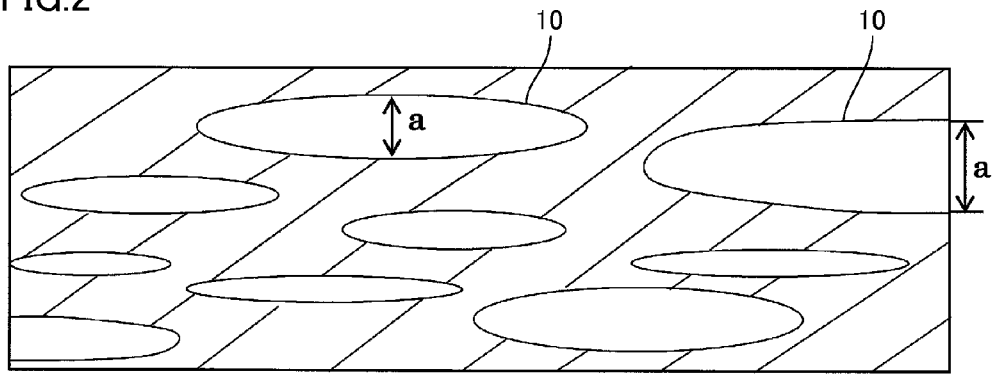

FIG.3
(a)
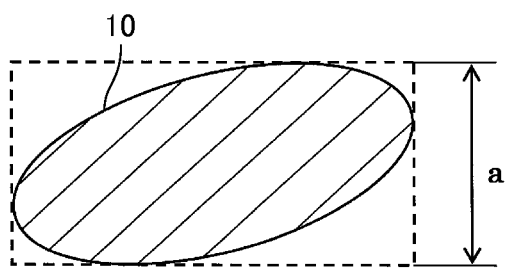
(b)
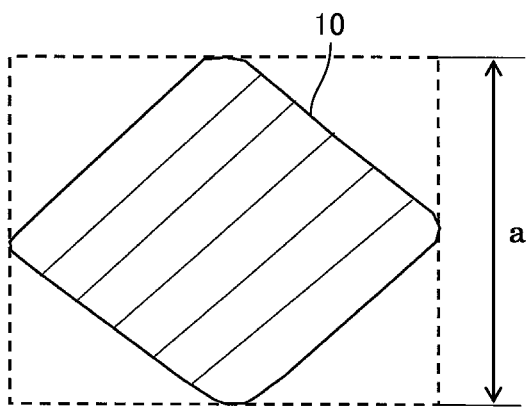
(c)
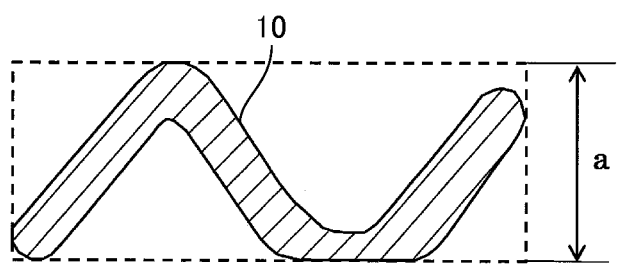

FIG.7
(a)
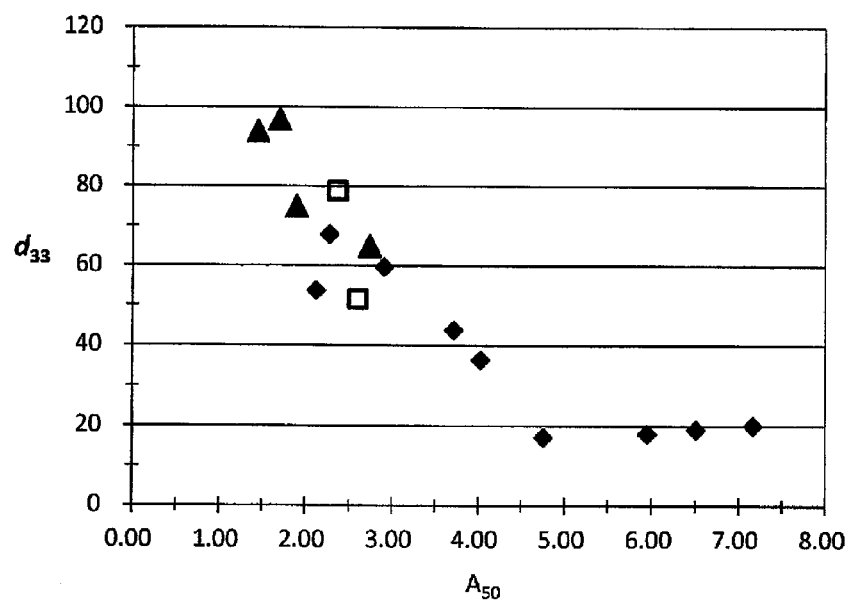
(b)
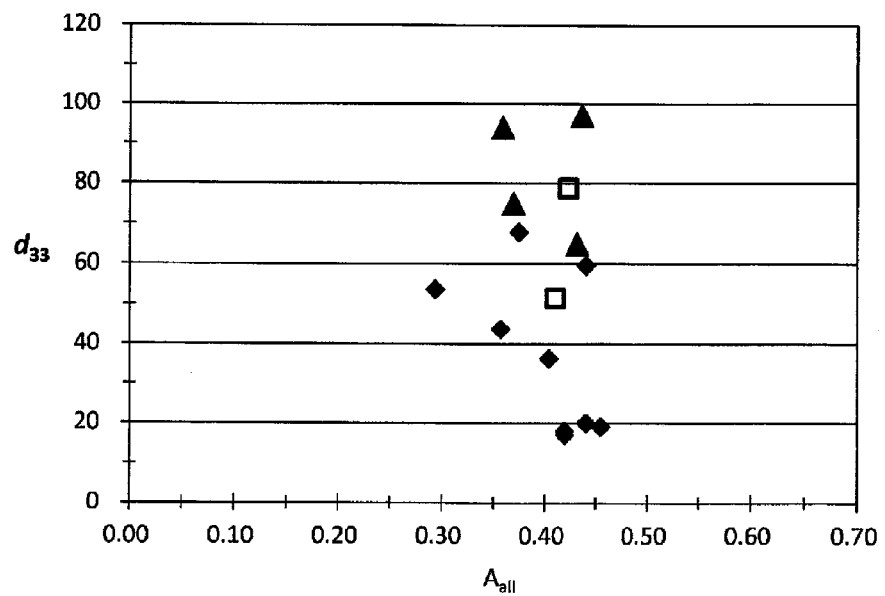

FIG.8
(a)
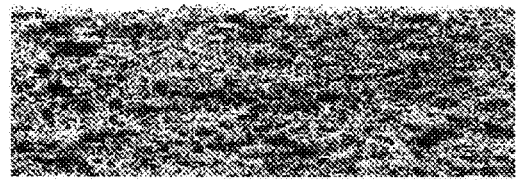
(b)

PIEZOELECTRIC ELEMENT INCLUDING FLUORORESIN FILM

TECHNICAL FIELD

The present invention relates to a piezoelectric element including a plastic film that can be used in sensors such as an ultrasonic sensor, a contact sensor and a pressure-sensitive sensor, switches, microphones, headphones, speakers and the like. More specifically, the present invention relates to a piezoelectric element including a porous fluororesin film.

BACKGROUND ART

A piezoelectric plastic film has flexibility and bendability that piezoelectric ceramic does not have. Particularly, a piezoelectric fluororesin film also has excellent properties such as heat resistance, wear resistance and chemical resistance. Therefore, the piezoelectric fluororesin film is a promising material for a piezoelectric element.

A piezoelectrically-treated polyvinylidene fluoride (PVDF) film is commonly known as the piezoelectric fluororesin film. Generally, a beta-type crystal of PVDF can be produced by stretching. Since this beta-type crystal has a polarity, the piezoelectricity can be generated by performing polarization treatment to orient molecular dipoles to the same direction.

Japanese Patent Laying-Open No. 60-055034 (PTD 1), for example, discloses fabrication of a piezoelectric element by using a method including the steps of: monoaxially stretching an unoriented sheet of approximately 100 μm in thickness obtained by melt extrusion molding of PVDF; vacuum-depositing metal on both surfaces of the monoaxially-stretched film to form an electrode; and applying a DC high electric field of approximately 1000 kV/cm in the film thickness direction for 60 minutes, while performing heating at a temperature equal to or lower than the melting point of the film.

However, according to the method described in PTD 1, a high voltage and application of the voltage for a long time are required to provide the piezoelectricity, and in addition, the obtained piezoelectricity is insufficient. Moreover, if pores are present in the film, air discharge or breakdown occurs during polarization treatment. Therefore, it becomes difficult to achieve application of a high voltage and further uniform application of an electric field. As a result, it is conceivable that sufficient piezoelectricity is not produced.

Under such circumstances, various methods for enhancing the piezoelectricity of the piezoelectric fluororesin film have been proposed.

Japanese Patent Laying-Open No. 06-342947 (PTD 2), for example, proposes performing polarization treatment on a PVDF film, with pores of the porous PVDF film impregnated with an insulation oil and with the PVDF film sandwiched between a pair of dielectric sheets.

Specifically, Example 1 of PTD 2 describes that a solution of vinylidene fluoride (VDF)/trifluoroethylene (TrFE) copolymer is casted on a glass plate and dried to form a porous film (porosity: 70%, average pore size: 0.45 μm) of a communication pore type having a film thickness of 130 μm, and the porous film is sandwiched between PVDF-based monoaxially-stretched sheets, and polarization treatment is performed on the porous film by corona charging. Example 2 describes that the porous film in Example 1 is impregnated with the insulation oil and polarization treatment is performed on the porous film in the same manner as described above. PTD 2 also describes that the piezoelectric property (an amount of increase in electric charges with respect to pressure increase) of the piezoelectric porous films obtained in Examples 1 and 2 is higher than that obtained in the case of corona charging of the porous film alone (Comparative Examples).

In addition, Japanese National Patent Publication No. 2009-501826 (PTD 3) proposes applying pressure, under heating, to a beta-phase porous PVDF film obtained from a solution having PVDF dissolved in dimethylformamide (DMF) or dimethylacetamide (DMA), thereby crushing pores. According to this method, the piezoelectricity is enhanced by crushing the pores and transforming the PVDF film into a substantially beta-phase nonporous film.

As described above, in the PVDF-based film, an attempt to enhance the piezoelectricity is made by increasing a ratio of the beta-type crystal portion that produces the piezoelectricity or preventing air discharge that impairs the effect of polarization treatment. However, the effect of enhancing the piezoelectricity is insufficient. In addition, heating causes the beta-type crystal of PVDF to return to the alpha type that does not have the piezoelectricity. Therefore, the PVDF-based film is not satisfactory in terms of heat resistance as well.

As a piezoelectric plastic film that produces the piezoelectricity by a mechanism totally different from a PVDF film that produces the piezoelectricity due to its molecular structure and crystal structure, U.S. Pat. No. 4,654,546 (PTD 4) proposes a stretched porous polypropylene film having disc-like bubbles.

In recent years, this porous polypropylene film has been commercially available as an Emfit (registered trademark) ferroelectret film from Emfit, Ltd. and has received attention because this film exhibits a high piezoelectric modulus. This Emfit (registered trademark) film is a film having a lamellar structure with many flat pores, which is formed by biaxially stretching a porous polypropylene film and further injecting a high-pressure gas to expand the pores in the film [http://www.emfit.com/en/sensors/products_sensors/emfit-film/ (NPD 1, homepage of Emfit, Ltd.)]. When corona discharge of such a film is performed, positive and negative electric charges are trapped in upper and lower surfaces of the pores and the film has the piezoelectricity. There is also a report that a piezoelectric constant $d_{33}$ of the Emfit (registered trademark) film is several tens times as large as that of the PVDF film [http://www.europrotech.com/Euro/trade/t_emfit2.html (NPD 2, homepage of Europrotech LLC, especially Table 1)].

In addition, as described in Masatoshi Nakayama, et al., "Piezoelectricity of Ferroelectret Porous Polyethylene Thin Film", Japanese Journal of Applied Physics 48 (2009) (NPD 3), it is reported that piezoelectric constant $d_{33}$ of a piezoelectric film obtained by corona discharge of a ferroelectret film having a thickness of 30 μm and a porosity of 58% and made of porous polyethylene (Fp-PE) is three times as large as that of the PVDF film.

Generation of the piezoelectricity of porous polypropylene and porous polyethylene is based on electrical charging of micron-size to submillimeter-size pores, which is totally different from production of the piezoelectricity based on a dipole due to the nano-size molecular structure and crystal structure of PVDF.

As a piezoelectric element made of a porous fluorine-based resin that produces the piezoelectricity based on electrical charging of pores, Japanese Patent Laying-Open No. 2007-231077 (PTD 5), for example, proposes a piezoelectric element fabricated by mixing a foaming agent into tetrafluoroethylene-hexafluoropropylene copolymer (FEP) and foaming the copolymer to form a sheet (thickness: 200 μm, foaming rate: 40%) having closed pores, and causing electric charges to be trapped in this sheet by using a corona discharge device. PTD 5 describes that this piezoelectric element exhibits a quasi-static piezoelectric constant $d_{33}$ larger than that of a piezoelectric element fabricated by corona discharge of a nonporous fluororesin film in the same manner.

As described above, higher piezoelectricity may be obtained than that of the PVDF film that produces the piezoelectricity based on the dipole due to the nano-size molecular structure and crystal structure. Therefore, a method for enhancing the piezoelectricity by using a porous plastic film other than the PVDF film has been under study in recent years.

As an electret having high piezoelectricity comparable to that of an inorganic piezoelectric material and formed of a polymer porous body excellent in workability, Japanese Patent Laying-Open No. 2010-186960 (PTD 6), for example, describes an electret in which "an average aspect ratio of a pore is 7 or more and 30 or less, the average number of pores in a thickness direction is 1 or more and 10 or less, and an average pore diameter in the thickness direction is 30 μm or larger and 200 μm or smaller" (claim 1). A polypropylene foam obtained by biaxially stretching an organic polymer foam is used as the polymer porous body (Examples). PTD 6 describes in paragraph 0011 that by forming a pore having a large aspect ratio, the pore diameter is increased and the piezoelectric performance comparable to that of an inorganic piezoelectric body is obtained. In addition, an average value of diameters in the thickness direction obtained by observing a cross section cut in parallel to the stretching direction with a scanning electron microscope is used as the pore diameter (paragraph 0026).

In addition, Japanese Patent Laying-Open No. 2011-018897 (PTD 7) and Japanese Patent Laying-Open No. 2011-210865 (PTD 8) propose a porous resin sheet for a piezoelectric element which has a bubble having an average maximum vertical chord length of 1 to 40 μm and an average aspect ratio (average maximum horizontal chord length/average maximum vertical chord length) of 0.7 to 4.0, and which has a volumetric porosity of 20 to 75%. Such a porous resin sheet is manufactured by mixing a resin forming a plastic film with a phase separation agent to fabricate a sheet having a sea-island structure in which the phase separation agent is an island, curing the resin component, and thereafter, removing the island of the phase separation agent. Polyetherimide and annular olefin polymer are used as the resin component (Examples).

An object of the invention disclosed in PTD 7 is to provide the porous resin sheet for a piezoelectric element having a high piezoelectric modulus and a high compressive stress. PTD 7 describes in paragraph 0013 that this object can be achieved by increasing the size of a bubble forming a dipole to increase an amount of change in the dipole, and decreasing the aspect ratio to adjust an elastic modulus in the thickness direction. PTD 7 also describes in paragraph 0014 that when the average maximum vertical chord length exceeds 40 μm, the voltage density applied to bubbles during electrical charging treatment becomes lower and spark discharge becomes less likely to occur. PTD 7 discloses in Table 1 that piezoelectric constant $d_{33}$ of a piezoelectric film including a porous resin film (polyetherimide, cycloolefin copolymer, polystyrene) having an average maximum vertical chord length of 2.63 μm to 4.80 μm is 66 to 1449 pC/N.

Along with the recent widespread use of electronic terminals such as a touch panel, use of a piezoelectric element formed of a plastic film in the touch panel and the like has also been under study. High transparency is desired for the piezoelectric element formed of the plastic film which is used in such an application.

CITATION LIST

Patent Document

PTD 1: Japanese Patent Laying-Open No. 60-055034
PTD 2: Japanese Patent Laying-Open No. 06-342947
PTD 3: Japanese National Patent Publication No. 2009-501826
PTD 4: U.S. Pat. No. 4,654,546
PTD 5: Japanese Patent Laying-Open No. 2007-231077
PTD 6: Japanese Patent Laying-Open No. 2010-186960
PTD 7: Japanese Patent Laying-Open No. 2011-018897
PTD 8: Japanese Patent Laying-Open No. 2011-210865

Non Patent Document

NPD 1: http://www.emfit.com/en/sensors/products_sensors/emfit-film/
NPD 2: http://www.europrotech.com/Euro/trade/t_emfit2.html
NPD 3: Masatoshi Nakayama, et al., "Piezoelectricity of Ferroelectret Porous Polyethylene Thin Film", Japanese Journal of Applied Physics 48 (2009)

SUMMARY OF INVENTION

Technical Problem

As described above, various methods for enhancing the piezoelectricity of a piezoelectric element including a plastic film and various piezoelectric plastic films with enhanced piezoelectricity have been proposed. At present, however, a piezoelectric plastic film that can satisfy the piezoelectric performance, the heat resistance and further the transparency is not yet developed.

An object of the present invention is to provide a piezoelectric element which is made of a fluororesin having heat resistance and which produces excellent piezoelectricity based on electrical charging of pores.

Solution to Problem

A piezoelectric element of the present invention includes: a porous fluororesin film made of a first fluororesin; and a nonporous fluororesin layer stacked on at least one surface of the porous fluororesin film and made of a second fluororesin, wherein the first fluororesin is different in type from the second fluororesin, and when 50 pores are selected in descending order from a pore having the longest thickness-direction length, of pores present in a cut surface of the porous fluororesin film in a thickness direction, an average value $A_{50}$ of thickness-direction lengths of the 50 pores is 3 μm or smaller.

Preferably, a porosity of the porous fluororesin film is 10 to 40%.

Preferably, the porous fluororesin film is a stretched porous polytetrafluoroethylene film. In this case, the second fluororesin is preferably tetrafluoroethylene-hexafluoropropylene copolymer (FEP) or tetrafluoroethylene-perfluoroalkyl vinyl ether copolymer (PFA).

Preferably, a thickness of the porous fluororesin film is 5 to 80 μm. Preferably, the porous fluororesin film is formed by compression in the thickness direction under heating.

Preferably, the piezoelectric element of the present invention is formed by superimposing a film obtained by drying a dispersion liquid of the second fluororesin and the porous fluororesin film on each other, and thereafter, heating the films to join and integrate the films. In addition, preferably, the piezoelectric element of the present invention includes the porous fluororesin film and the nonporous fluororesin layers stacked on both surfaces of the porous fluororesin film.

Preferably, in the piezoelectric element of the present invention, a total light beam transmittance is 90% or higher.

The present invention covers a sensor including the aforementioned piezoelectric element of the present invention and a piezoelectric element mounting substrate. The piezoelectric element of the present invention includes the aforementioned piezoelectric element of the present invention and a substrate having an electrode terminal, wherein the piezoelectric element and the electrode terminal are connected by solder having a melting point of 150° C. or lower or an electrically conductive adhesive.

Advantageous Effects of Invention

The piezoelectric element of the present invention is formed of a fluororesin film having excellent heat resistance, and also has high piezoelectricity.

BRIEF DESCRIPTION OF DRAWINGS

FIG. 1 is a flowchart describing a procedure for selecting a porous fluororesin film used in the present invention.

FIG. 2 is a diagram for describing a definition of a thickness-direction length of a pore.

FIG. 3 is a diagram for describing a definition of a thickness-direction length of a pore.

FIG. 7 is a graph showing a relationship between the pore size and the piezoelectric performance of the porous fluororesin film, and FIG. 7(a) is a graph whose horizontal axis indicates an average value $A_{50}$ of the top 50 pores, and FIG. 7(b) is a graph whose horizontal axis indicates an average value $A_{all}$ of all pores.

FIG. 8(a) is an SEM photograph of a cross section of a stretched porous PTFE film No. 8 in the thickness direction, and FIG. 8(b) is an image after binarization processing of the image in FIG. 8(a).

DESCRIPTION OF EMBODIMENTS

Figure 4:
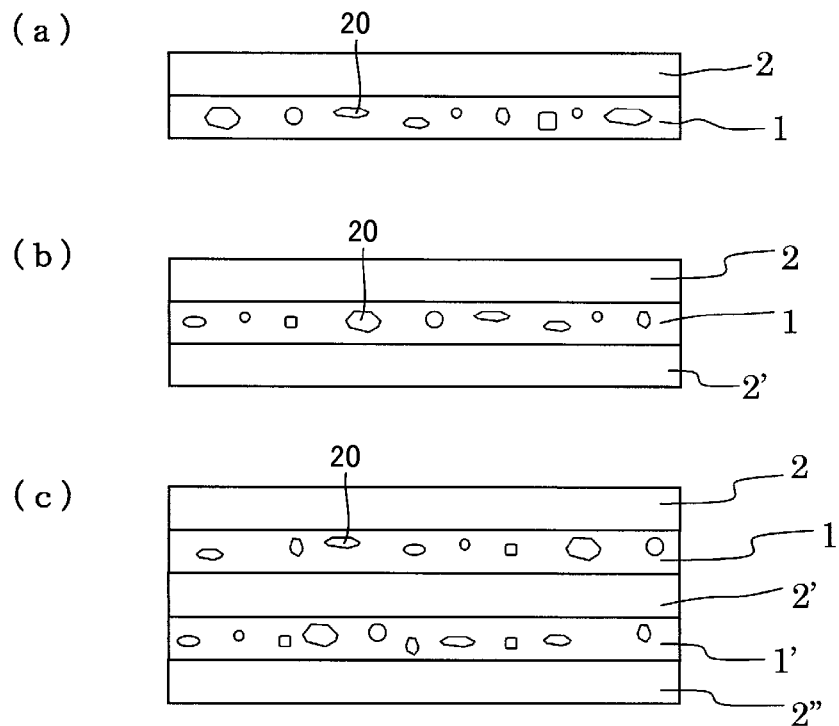
FIG. 4 is a schematic cross-sectional view showing an example of a configuration of a composite fluororesin film and a piezoelectric element according to the present invention.

While embodiments of the present invention will be described hereinafter, it should be understood that the embodiments disclosed herein are illustrative and not limitative in any respect. The scope of the present invention is defined by the terms of the claims, and is intended to include any modifications within the scope and meaning equivalent to the terms of the claims.

A piezoelectric element according to the present invention is a piezoelectric element formed by piezoelectric treatment of a composite fluororesin film including a porous fluororesin film made of a first fluororesin, and a nonporous fluororesin layer stacked on at least one surface of the porous fluororesin film and made of a second fluororesin. The porous fluororesin film is characterized in that when 50 pores are selected in descending order from a pore having the longest thickness-direction length, of pores present in a cut surface of the porous fluororesin film in a thickness direction, an average value $A_{50}$ of thickness-direction lengths of the 50 pores is 3 μm or smaller.

Composite Fluororesin Film for Piezoelectric Element

The composite fluororesin film forming the piezoelectric element of the present invention will be described first. The composite fluororesin film forming the piezoelectric element of the present invention is formed by stacking the nonporous fluororesin layer on the porous fluororesin film.

(1) Porous Fluororesin Film

The porous fluororesin film used in the present invention may at least be a porous fluororesin film having pores in which electric charges can be trapped by corona discharge and the like. Although the porosity is not particularly limited, the porosity is preferably 10 to 40%, and more preferably approximately 15 to 35%. If the porosity is too high, repeated application of stress or continued application of stress for a long time causes deformation over time and the piezoelectric performance changes. If the porosity is too low, deformation in the thickness direction required for production of the piezoelectricity is less likely to occur.

The first fluororesin forming the porous fluororesin film is preferably polytetrafluoroethylene (PTFE). In addition to this, a porous film made of tetrafluoroethylene-perfluoroalkyl vinyl ether copolymer (PFA), tetrafluoroethylene-hexafluoropropylene copolymer (FEP), tetrafluoroethylene-hexafluoropropylene-perfluoroalkyl vinyl ether (EPA), tetrafluoroethylene-ethylene copolymer (ETFE), polyvinylidene fluoride, polychlorotrifluoroethylene, chlorotrifluoroethylene-ethylene copolymer, or a mixture of one or two or more of them and PTFE, or the like can also be used. Tetrafluoroethylene-based copolymer such as PFA, FEP and EPA may be any of random copolymer, block copolymer and pendant-type copolymer.

The porous fluororesin film can be manufactured by using a method of extruding a mixture (paste) of a fine powder of the first fluororesin and a lubricant into the form of a sheet or tube, rolling the mixture as needed, and thereafter, stretching and sintering the mixture, a method of applying a dispersion liquid of the first fluororesin (such as PTFE) onto a base material, evaporating and drying the dispersion medium, and thereafter, heating the rest to a temperature equal to or higher than the melting point of the first fluororesin to sinter the rest, and thereafter, stretching the rest, or other methods. When the tube-like extrudate is used, the tube-like extrudate may be shaped into a film by incision. The stretching treatment may be monoaxial stretching or biaxial stretching.

The porous fluororesin film manufactured by using the aforementioned method has various pore shapes and porosities, depending on a manufacturing method, a stretching method and the like. Usually, however, stretched porous PTFE has a mesh-like structure in which PTFE particle aggregate (secondary particle) portions called "nodes" are connected by a fibrous PTFE portion called "fibril". In the film having such a mesh-like structure, a space between the fibrils and between the fibril and the node corresponds to the pore.

A commercially available film can also be used as the porous fluororesin film. For example, "Goretex" (registered trademark), "Poreflon" (registered trademark) manufactured by Sumitomo Electric Fine Polymer, Inc., and the like may be used.

The porous fluororesin film used in the present invention is the aforementioned porous fluororesin film, in which average value $A_{50}$ of thickness-direction lengths of 50 pores selected in descending order from a pore having the longest thickness-direction length a in a cross section obtained by cutting the film in parallel to the thickness direction of the film is 3 μm or smaller.

The inventors of the present invention conducted various studies of a relationship between the pores and the piezoelectricity of the porous fluororesin film. As a result of their studies, the inventors of the present invention found that the piezoelectricity of the porous fluororesin film is highly correlated with thickness-direction length a of a pore having long thickness-direction length a. Therefore, one feature of the present invention is to use a porous fluororesin film producing high piezoelectricity, which is selected by focusing attention on a pore having long thickness-direction length a. "Average $A_{50}$ of the top 50 pores having long thickness-direction lengths a is 3 μm or smaller" specifically refers to a porous fluororesin film selected based on a process flow shown in FIG. 1 and the specific procedure of the process flow is as follows.

First, the porous fluororesin film is cut in parallel to the thickness direction of the film by FIB processing or freeze fracture, and an image of the obtained cross section is taken by a scanning electron microscope and the like to acquire image data (S101). Cutting of the film herein may at least be cutting by which the cross section parallel to the thickness direction of the film is obtained, and there are a case of cutting the film in parallel to the longitudinal direction of the film and a case of cutting the film in parallel to the width direction of the film, while the present invention is not particularly limited. In the case of the stretched porous fluororesin film, however, it is preferable to acquire a plane by cutting the film in parallel to the stretching direction (to the initially stretching direction in the case of biaxial stretching) because the stretched porous fluororesin film has anisotropy by stretching treatment.

Next, the acquired cross-section image is subjected to binarization processing based on a prescribed threshold value such that the pore portion can be sufficiently distinguished from the non-pore portion (S102). Next, based on the obtained binarized image data, thickness-direction length a of each pore is measured (S103). Thickness-direction length a of the pore herein refers to, assuming a minimum rectangle (vertical direction: thickness direction, horizontal direction: film in-plane direction) including each pore shape, the length in the vertical direction thereof. For example, when an elliptical image is obtained as a pore image 10 as in the example shown in FIG. 2 as a result of binarization processing and the long axis of the ellipse is substantially parallel to the film surface direction, the short axis of the ellipse corresponds to thickness-direction length a. On the other hand, when pore image 10 obtained as a result of binarization processing has an elliptical shape inclined with respect to the film surface as shown in FIG. 3(a) or has a shape other than the elliptical shape as shown in FIGS. 3(b) and 3(c), the length in the vertical direction of an imaginary minimum rectangle (broken line in the figures) surrounding these pores corresponds to thickness-direction length a.

Based on the binarized image obtained as described above, thickness-direction lengths a of the pores are arranged in descending order, and average value $A_{50}$ of thickness-direction lengths a of 50 pores from a pore having the longest thickness-direction length a is obtained (S104), and a porous fluororesin film in which $A_{50}$ is 3 μm or smaller is selected (S105). The porous fluororesin film thus selected is used in the present invention.

In the porous fluororesin film used in the present invention, as a selection index for obtaining high piezoelectricity, 3 μm, the average value of the top 50 pores having long thickness-direction lengths a, which is highly correlated with the piezoelectricity, is used as the threshold value. This is, however, merely one representative example. A porous fluororesin film that produces the same level of piezoelectricity is also obtained by changing the number of pores for calculating an average value, setting a threshold value corresponding to this, and selecting a porous fluororesin film smaller than the threshold value. In short, a threshold value that produces high piezoelectricity may be set in a range where high correlation is obtained between the piezoelectricity and the average value of the prescribed number of pores from a pore having the longest thickness-direction length a, and a porous fluororesin film that produces high piezoelectricity may be selected based on the threshold value. In the present invention, with consideration given to variations at cross-sectional sites and the like of a film cross section used as the selection index data, 50 pores are typically selected as the number of pores that allows these variations to fall within a range of error, and the average value thereof is used. However, in order to select a porous fluororesin film that produces the same level of piezoelectricity, an average value of the number of pores in which a correlation coefficient between an average value of thickness-direction lengths a and a piezoelectric value is high, and preferably an average value of the number of pores in which an absolute value of the correlation coefficient is 0.8 or more, and specifically an average value of approximately the top 40 to 70 pores may be used. In this case, a threshold value is set as appropriate based on the correlation with the piezoelectricity.

"3 μm" used as the threshold value in the present invention may usually include an error of approximately ±20%, depending on the variations at the used cut surface or cut site. Therefore, used in the present invention is a porous fluororesin film in which average value $A_{50}$ of thickness-direction lengths a of the top 50 pores is up to approximately 3.5 μm. In order to obtain a piezoelectric element formed of a highly-transparent fluororesin film, 2.5 μm is preferably used as the threshold value.

On the other hand, in the porous fluororesin film used in the present invention, the lower limit of thickness-direction length a is desirably 0.5 μm or larger. This is because, in the porous fluororesin film of the present invention, deformation in the thickness direction produces the piezoelectricity and it tends to be difficult to obtain the appropriate level of displacement if thickness-direction length a is less than 0.5 μm.

The thickness of the porous fluororesin film used in the present invention is preferably 5 to 80 μm, and more preferably 7 to 30 μm, from the viewpoints of ease of piezoelectric treatment, efficiency of providing the piezoelectric property, flexibility as a piezoelectric sensor, and the like, although it is not particularly limited. When a piezoelectric element formed of a highly-transparent fluororesin film is desired, a porous fluororesin film having a thickness of 7 to 20 μm is preferably used.

The aforementioned porous fluororesin film may be further compressed in the thickness direction. By compression, the porous fluororesin film tends to become thinner, and further, thickness-direction length a of the pore tends to become shorter. Compression in the thickness direction may be performed by pressing the film of a prescribed size with a pressing machine and the like, or by winding up the long film while rolling the film with a rolling roll.

The aforementioned compression treatment is preferably performed under heating. By compression under heating, thickness-direction length a can be efficiently decreased. The heating temperature at the time of compression is usually 100° C. or higher, and preferably 110 to 200° C., although it is selected as appropriate, depending on the type of the first fluororesin forming the porous fluororesin film.

In addition, the porous fluororesin film used in the present invention may at least have pores that can be electrically charged by piezoelectric treatment, and the porosity thereof is usually 10 to 40%, and preferably 15 to 35%. The porosity herein refers to a rate of a pore volume $V_0$ to an apparent volume V of the porous fluororesin film, and is obtained in accordance with the following equation:

porosity(%)=$(V_0/V)\times 100$.

In the equation, apparent volume V of the porous fluororesin film is calculated from the area and the thickness of the film. Pore volume $V_0$ is calculated by dividing a dry weight of the porous fluororesin film by a true specific gravity of the resin (2.17 g/cm$^3$ in the case of PTFE) to obtain a resin portion volume R of the porous fluororesin film, and subtracting resin portion volume R from the apparent volume of the porous fluororesin film ($V_0$=V−R).

(2) Nonporous Fluororesin Layer

The nonporous fluororesin layer forming the composite fluororesin film of the present invention is made of the second fluororesin that is a different type of fluororesin from the first fluororesin forming the aforementioned porous fluororesin film.

The second fluororesin may at least be a different type of fluororesin from the first fluororesin. Specifically, depending on the type of the first fluororesin, a fluororesin is selected, which is different in type from polytetrafluoroethylene (PTFE), tetrafluoroethylene-perfluoroalkyl vinyl ether copolymer (PFA), tetrafluoroethylene-hexafluoropropylene copolymer (FEP), tetrafluoroethylene-hexafluoropropylene-perfluoroalkyl vinyl ether (EPA), tetrafluoroethylene-ethylene copolymer (ETFE), polyvinylidene fluoride, polychlorotrifluoroethylene, tetrafluoroethylene-ethylene copolymer, chlorotrifluoroethylene-ethylene copolymer, and a mixture of two or more of them, and the like.

Since polytetrafluoroethylene (PTFE) is preferably used as the first fluororesin, tetrafluoroethylene-perfluoroalkyl vinyl ether copolymer (PFA) or tetrafluoroethylene-hexafluoropropylene copolymer (FEP) is preferably used as the second fluororesin. It is also possible to use a fluororesin belonging to so-called modified PTFE and having perfluoroethylene or a polymer block thereof, or hexafluoropropylene or a polymer block thereof at a side chain or an end of polytetrafluoroethylene.

The nonporous fluororesin layer may at least be substantially nonporous, and specifically is a fluororesin layer in which a Gurley second is 300 seconds or longer, preferably 1000 seconds or longer, and more preferably 5000 seconds or longer.

In addition, the thickness of the nonporous fluororesin layer is preferably 30 µm or smaller, more preferably 2 to 25 µm, and further preferably 5 to 20 µm. If the thickness exceeds 30 µm, it becomes difficult to obtain the effect of enhancing the piezoelectricity by the porous fluororesin film in the composite fluororesin film. If the thickness is less than 2 µm, uniform film formation is difficult.

A method for manufacturing the nonporous fluororesin layer is not particularly limited, and the nonporous fluororesin layer can be manufactured by using, for example, a method disclosed in WO2008/018400 pamphlet. Specifically, according to this method, a fluororesin dispersion having a second fluororesin powder dispersed in a dispersion medium is applied onto a smooth foil, and thereafter, the dispersion medium is dried and the second fluororesin powder is sintered, and thereafter, the smooth foil is removed.

There are also a method of using a porous base body and injecting a fluororesin dispersion between this base body and a smooth foil, and other methods. Injection of the fluororesin dispersion between the base body and the smooth foil can be performed by using a method of coating the base body with the fluororesin dispersion, and thereafter, overlaying the smooth foil to prevent entry of bubbles, and a coater of a capillary type, a gravure type, a roll type, a die (lip) type, a slit type, a bar type or the like can be used as an application device. Among these, the coaters of a capillary type, a die type, a slit type, and a bar type are preferably used because formation of a thin film is easy.

A metal foil, especially a copper foil and an aluminum foil are preferably used as the foil. When the metal foil is used to manufacture the nonporous fluororesin thin film, the nonporous fluororesin thin film may be subjected to piezoelectric treatment with this metal foil maintained, or may be subjected to piezoelectric treatment with a part of the metal foil removed by etching and the like. In these cases, the metal foil can form into an electrode and a circuit of the piezoelectric element.

By using the aforementioned method disclosed in WO2008/018400 pamphlet, there can be obtained a substantially nonporous fluororesin thin film in which a Gurley second is 300 seconds or longer, and preferably 1000 seconds or longer.

(3) Composite Fluororesin Film

The composite fluororesin film used in the present invention is formed by stacking the aforementioned nonporous fluororesin layer on one surface or both surfaces of the aforementioned porous fluororesin film.

A combination of the porous fluororesin film and the nonporous fluororesin layer stacked is selected such that the fluororesins (the first fluororesin and the second fluororesin) as constituent materials are different from each other. Porous PTFE is preferably selected as the porous fluororesin (the first fluororesin), and tetrafluoroethylene-perfluoroalkyl vinyl ether copolymer (PFA) or tetrafluoroethylene-hexafluoropropylene copolymer (FEP) is preferably selected as the nonporous fluororesin (the second fluororesin).

Stacking the porous fluororesin film and the nonporous fluororesin layer may be performed by superimposing, on each other, the porous fluororesin film and a film serving as the nonporous fluororesin layer that are separately fabricated, and thereafter, pressure bonding these films to stack and integrate these films, or may be performed by superimposing the porous fluororesin film and the film serving as the nonporous fluororesin layer on each other, and thereafter, sintering these films to integrate these films, or may further be performed by using the porous fluororesin film as a base body, and forming the nonporous fluororesin layer thereon to integrate the film and the layer.

Specific examples of a method for manufacturing the composite fluororesin film include, for example, (1) a method of applying the dispersion for the nonporous fluororesin layer (the second fluororesin) onto the foil such as the metal foil and drying the dispersion, and thereafter, superimposing the porous fluororesin film, and performing heating and sintering to a temperature equal to or higher than the melting point of the second fluororesin to join and integrate the layer and the film, (2) a method of applying the dispersion having the second fluororesin powder for the nonporous fluororesin layer dispersed therein onto a surface of the porous fluororesin film used as the base body, overlaying the smooth foil such as the metal foil, and performing heating and sintering at a temperature equal to or higher than the melting point of the second fluororesin, (3) a method of superimposing, on each other, the porous fluororesin film and the nonporous fluororesin film fabricated separately and pressure bonding these films (preferably, heating these films to a temperature equal to or higher than the melting point of the second fluororesin and pressure bonding these films) to integrate these films, and other methods. Among these, the method (1) or (2) is preferably used. Particularly when PTFE is used as the first fluororesin and a fluororesin having the melting point lower than that of PTFE (preferably FEP, PFA) is used as the second fluororesin, the aforementioned method (1) or (2) causes the second fluororesin to melt and a part thereof to be impregnated into the pores of the porous fluororesin film during heating and sintering. As a result, the joining strength of the nonporous fluororesin layer and the porous fluororesin film is increased, and in addition, the fluororesin is filled into the pores forming concave and convex portions at an interface between the nonporous fluororesin layer and the porous fluororesin film. Therefore, the effect of achieving high transparency of the obtained composite fluororesin film is also obtained easily.

The composite fluororesin film may at least be a composite fluororesin film formed by stacking the nonporous fluororesin layer on at least one surface of the porous fluororesin film. Examples of the composite fluororesin film include a composite fluororesin film formed by stacking a nonporous fluororesin layer 2 on one surface of a porous fluororesin film 1 having pores 20 as shown in FIG. 4(a), a composite fluororesin film formed by stacking nonporous fluororesin layers 2 and 2' on both surfaces of porous fluororesin film 1 as shown in FIG. 4(b), a composite fluororesin film having a multilayer structure as shown in FIG. 4(c), and the like. The composite fluororesin film is preferably a composite fluororesin film formed by stacking the nonporous fluororesin layers on both surfaces of the porous fluororesin film. By stacking the nonporous fluororesin layers on both surfaces, a surface layer of the composite fluororesin film becomes a smooth surface. Therefore, there is an effect of reducing diffused reflection of light at the surface and easily obtaining a highly-transparent piezoelectric element.

In the multilayer stacked structure shown in FIG. 4(c), porous fluororesin films 1 and 1' may be the same as each other, or may be different from each other. In addition, the types of the fluororesins forming nonporous fluororesin layers 2, 2' and 2" may be the same as one another, or may be different from one another.

The composite fluororesin film forming the piezoelectric element of the present invention may be a composite fluororesin film formed by stacking a plurality of porous fluororesin films and a plurality of nonporous fluororesin layers, as long as the thickness of the composite fluororesin film as a whole is not large, and specifically the thickness ranges from 15 to 20 µm.

Piezoelectric Treatment

In order to provide the piezoelectricity to the composite fluororesin film, piezoelectric treatment is performed after stacking. Examples of the piezoelectric treatment include (A) a method of providing electrodes on both surfaces of the composite fluororesin film, and thereafter, applying a high voltage, (B) a method of keeping the composite fluororesin film under a high electric field for several minutes, without providing an electrode on the surface of the composite fluororesin film, (C) a method of placing a composite fluororesin film 502 on a metal plate 501 such as a copper plate, and electrically charging composite fluororesin film 502 by corona discharge by using a high voltage power supply (corona discharge device) 503 spaced apart from composite fluororesin film 502 by a prescribed spacing M (a distance between a needle tip and the composite fluororesin film is, for example, 8 mm), and other methods. Among these, the method by corona discharge is preferably used. A reference numeral 504 in FIG. 5 indicates an ammeter.

For reasons that are unknown, the piezoelectric element obtained by piezoelectric treatment of the composite fluororesin film fabricated as described above exhibits a higher piezoelectric constant ($d_{33}$: pC/N) than that of the piezoelectric element obtained by piezoelectric treatment of the porous fluororesin film alone. The piezoelectric constant ($d_{33}$: pC/N) herein refers to a coefficient showing a relationship between stress applied in the thickness direction and electric charges generated between opposing ends when the thickness direction of the film is triaxial.

In the present invention, in the case of using, as the composite fluororesin film, a composite fluororesin film in which at least a part of the metal foil used for manufacturing the nonporous fluororesin layer is left, the metal foil can be used as an electrode or a circuit of the piezoelectric element.

Uses of Piezoelectric Element

By affixing the metal foils or depositing metal and thereby attaching the electrodes on both surfaces of the composite fluororesin film piezoelectrically treated as described above, the piezoelectric element of the present invention having a high piezoelectric modulus can be obtained. For improvement of humidity resistance, prevention of shock and the like, the piezoelectric element desirably has a protective film such as a PET film on a surface thereof.

Based on the properties of the fluororesins that are the constituent materials of the composite fluororesin film, the piezoelectric element of the present invention is excellent in chemical resistance, heat resistance and humidity resistance, has flexibility, and has excellent piezoelectric performance. The piezoelectrically-treated piezoelectric element of the present invention can be used as a sensor. Specifically, the piezoelectric element of the present invention can be used for uses such as an ultrasonic sensor, a contact sensor and a pressure-sensitive sensor.

The piezoelectric element of the present invention can also be used with the piezoelectric element mounted on an external substrate such as a flexible printed wiring board and a rigid printed wiring board. A piezoelectric element mounting substrate according to the present invention is characterized in that the piezoelectric element of the present invention is connected to an electrode terminal of the external substrate by solder having the melting point of 150° C. or lower or an electrically conductive adhesive.

The electrically conductive adhesive herein refers to an adhesive containing a thermosetting resin such as an epoxy resin or a thermoplastic resin such as a phenoxy resin, electrically conductive particles (such as metal particles of Au, Ag, Ni, Cu, solder and the like) and a curing agent (such as imidazole-based, hydrazide-based and amine-based). The electrically conductive adhesive is preferably a film-like electrically conductive adhesive that fits the size of the electrode to be connected, and more preferably a film-like electrically conductive adhesive containing acicular particles as the electrically conductive particles. Further preferably, an anisotropic electrically conductive adhesive having anisotropy, i.e., having electrical conductivity only in the thickness direction, is used. When a non-anisotropic electrically conductive adhesive is used to connect a plurality of electrodes and a plurality of connection terminals facing the plurality of electrodes, it is necessary to individually place the adhesive on each pair of the electrode and the connection terminal facing the electrode. However, when the anisotropic electrically conductive adhesive is used, the adhesive can be collectively placed to connect the electrodes and the connection terminals, and thus, this is efficient. Particularly when the electrodes and the connection terminals are small (e.g., 3 mm or smaller at the narrowest portion) or when a distance between the electrodes and a distance between the connection terminals are small (e.g., 1.5 mm or smaller), it is difficult to place the non-anisotropic electrically conductive adhesive. Therefore, the anisotropic electrically conductive adhesive is desirable.

Regardless of the presence or absence of anisotropy, when the electrically conductive adhesive is used, the electrically conductive adhesive is usually heated to 130 to 180° C. to soften and melt, and thereafter, the electrically conductive adhesive is cured, thereby connecting the piezoelectric element serving as an adherend and the external electrode terminal.

Examples of the solder having the melting point of 150° C. or lower (may be referred to as "low-temperature solder") include, for example, Sn-52In (melting point: 117° C.), In-3Ag (melting point: 141° C.), Sn-30In-54Bi (melting point: 81° C.), 16Sn-52Bi-32Pb (melting point: 95° C.), 42Sn42-58Bi (melting point: 138° C.) and the like. When such low-temperature solder is used, the low-temperature solder is heated to 100 to 150° C. to soften and melt, and thereafter, the low-temperature solder is cured, thereby connecting the piezoelectric element serving as an adherend and the external electrode terminal.

As described above, both the electrically conductive adhesive and the low-temperature solder must be heated at the time of connection. However, the piezoelectric element of the present invention is more excellent in heat resistance than a piezoelectric element formed of a polyolefin film and a piezoelectric element formed of a PVDF film. Therefore, the piezoelectric element of the present invention has an advantage that connection to the external electrode terminal can be made by heating even in the case of the electrodes provided on both surfaces of the film.

In other words, in a conventional piezoelectric element formed of a plastic film such as a polyolefin film or a PVDF film, connection to the external substrate was made only by screwing and the like that do not require heating, from the viewpoint of heat resistance. Therefore, improvement has been sought in terms of the workability, the cost, the necessity of a space for screwing, and the like. However, by using, as a piezoelectric element, the piezoelectric element of the present invention having excellent heat resistance and made of fluororesin, these problems can be solved.

EXAMPLES

The best mode for carrying out the present invention will be described with reference to Examples. Examples do not limit the scope of the present invention.

Measurement and Calculation Method

A measurement method performed in Examples will be described first.

(1) Pore Size

A porous fluororesin film was cooled in liquid nitrogen, and thereafter, the porous fluororesin film was fractured in parallel to the film thickness direction and in parallel to the film stretching direction to obtain a cross section, and an image of the cross section was taken by using a low-acceler-ated high-resolution scanning electron microscope (Ultra 55 manufactured by Curl Zeisss Co., Ltd.) under such conditions that the accelerating voltage was 1.5 kV, the inclination was 0° and the observation magnification was 1000×. By using image processing software of particle analysis Ver. 3 manufactured by Sumikin Technology Co., Ltd., the obtained cross-section image (image in an area of 114 μm in the longitudinal direction×30 μm in the thickness direction) was binarizingly converted in a monochromatic image mode with 35 threshold values of 256 gray levels, to obtain a binarized image in which pores in the area were obtained as black portions. Based on this binarized image, vertical-direction lengths a (thickness-direction lengths a) and horizontal-direction lengths b of minimum rectangles (vertical direction: thickness direction, horizontal direction: film in-plane direction) including the pores were arranged in descending order from the maximum value, and an average value ($A_{50}$, $B_{50}$) of the top 50 pores (parameter n=50) and an average value ($A_{all}$, $B_{all}$) of all pores were calculated.

(2) Porosity (%)

Based on the area and the thickness of the porous fluororesin film, apparent volume V of the porous fluororesin film was obtained. In addition, pore volume $V_0$ was calculated by dividing a dry weight of the porous fluororesin film by a true specific gravity of the resin (2.17 g/cm³ in the case of PTFE) to obtain resin portion volume R of the porous fluororesin film, and subtracting resin portion volume R from the apparent volume of the porous fluororesin film ($V_0$=V−R). A porosity, which is a rate of pore volume $V_0$ to apparent volume V of the porous fluororesin film, was obtained in accordance with the following equation:

porosity(%)=($V_0$/V)×100.

(3) Piezoelectric Constant ($d_{33}$: pC/N)

Figure 6:
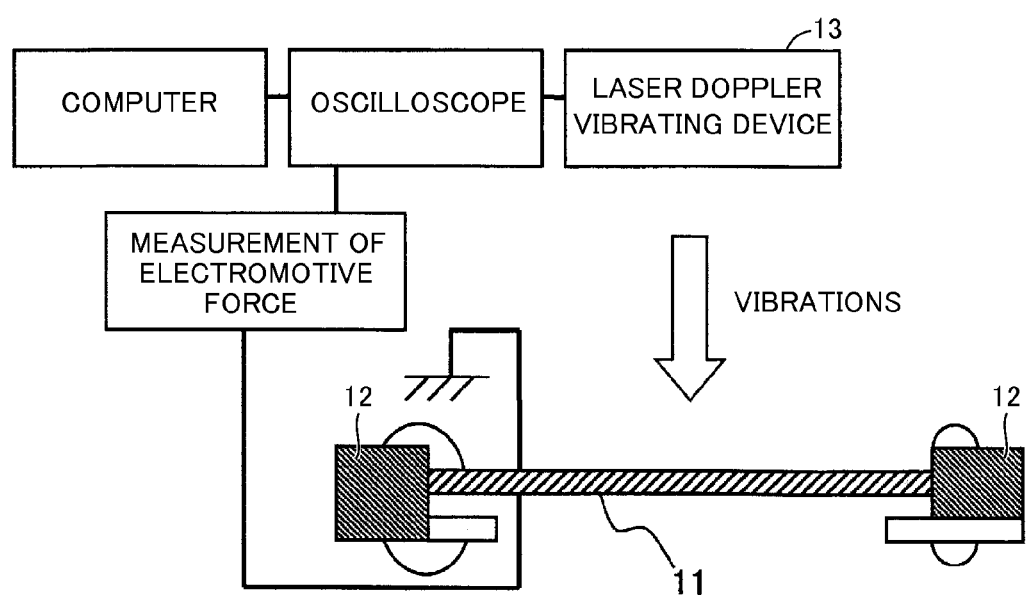
FIG. 6 is a diagram for describing a method for measuring piezoelectric constant $d_{33}$ adopted in Examples.

As shown in FIG. 6, gold 12 was vacuum-deposited on opposing end surfaces in the longitudinal direction of a sample film 11 which was the piezoelectric element or the porous fluororesin film, and an electrode of 3×3 cm² was formed. Vibrations in the thickness direction (in the z direction) at the time of application of an AC electric field (1 V, 90 Hz) were measured by using a laser Doppler vibrating device 13, and piezoelectric constant $d_{33}$ (pC/N) of sample film 11 in the thickness direction was calculated.

(4) Transparency

The transparency (transparent or opaque) of the obtained composite fluororesin film was visually checked.

A light beam (standard light C) was shed from the porous fluororesin film side on the composite fluororesin film that was visually determined as transparent, and in accordance with JIS K105, a total light beam transmittance (%) was measured by using a light beam transmittance meter HR-100 type manufactured by Murakami Color Research Laboratory.

Figure 5:
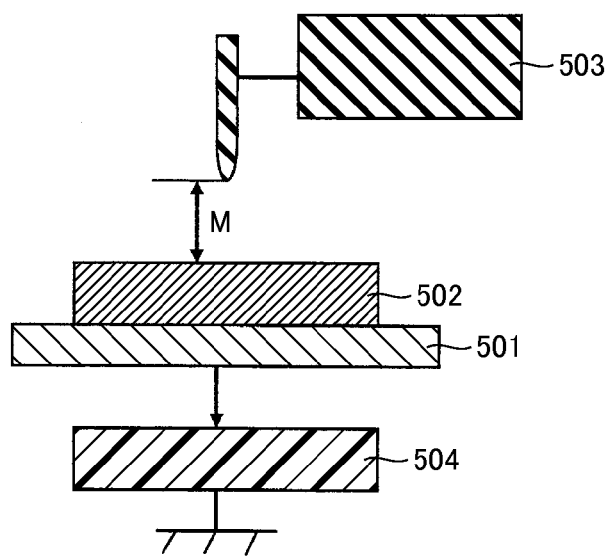
FIG. 5 is a diagram showing one example of a piezoelectric treatment method by corona discharge.

Relationship Between Thickness-Direction Length of Pore and Piezoelectricity of Porous Fluororesin Film As to 9 types of stretched porous PTFE films (No. 1 to 9) having different film thicknesses, porosities and pore sizes, stretched porous PTFE films (No. 10 and 11) stretched and thereafter compressed at 3 MPa under room temperature for 60 minutes, and stretched porous PTFE films (No. 12 to 15) stretched and thereafter compressed at 3 MPa under heating at 130° C. for 20 minutes, the pore size was calculated by using the aforementioned method. Next, as shown in FIG. 5, the stretched porous PTFE film was placed on metal plate 501 and piezoelectric treatment was performed by corona discharge (treatment was performed at a needle electrode of −8 kV under argon atmosphere for 90 seconds until a saturated current flew, and a current value was measured by using ammeter 504) by using high voltage power supply (corona discharge device) 503 spaced apart from the film by prescribed spacing M. Piezoelectric constant $d_{33}$ of the obtained piezoelectric film was measured by using the aforementioned measurement method. Table 1 shows the measurement result. In addition, FIG. 7(a) illustrates a graph showing a relationship between average value $A_{50}$ of thickness-direction lengths a obtained in accordance with the top 50 pores averaging method and piezoelectric constant $d_{33}$, and FIG. 7(b) illustrates a graph showing a relationship between average value $A_{all}$ of thickness-direction lengths a obtained in accordance with the all pores averaging method and piezoelectric constant $d_{33}$. In each graph, the measurement result of No. 10 and 11 is represented by a white square, the measurement result of No. 12 to 15 is represented by a black triangle, and the measurement result of No. 1 to 9 is represented by a black rhombus. FIG. 8(a) is an SEM photograph of the cross section of the stretched porous PTFE film No. 8 in the thickness direction, and FIG. 8(b) is an image after binarization processing of the image in FIG. 8(a).

Fabrication of Piezoelectric Film

Example 1

By using the stretched porous PTFE film No. 13 shown in Table 1 as a stretched porous PTFE film, a composite fluororesin film was fabricated as follows.

An aluminum foil having a thickness of 50 μm was spread and fixed onto a glass flat plate to prevent wrinkling, and a PFA dispersion (ALGOFLON MEA manufactured by Solvay Solexis) was dropped. Thereafter, a stainless steel slide shaft (product name: stainless fine shaft SNSF type, having an outer diameter of 20 mm) manufactured by Nippon Bearing Co., Ltd. was rolled to uniformly spread the PFA dispersion all over the aluminum foil. Before the moisture dries, the stretched porous PTFE film No. 13 was overlaid. Thereafter, steps of drying at 80° C. for 60 minutes, heating at 250° C. for 1 hour, heating at 320° C. for 1 hour, and heating at 317.5° C. for 8 hours were performed, and thereafter, natural cooling was performed. There was thus obtained a composite body having the nonporous PFA layer (thin film) of PFA joined onto the stretched porous PTFE film and further the aluminum foil fixed onto the nonporous PFA layer. Next, the aluminum foil was removed by dissolution with hydrochloric acid, and the composite fluororesin film was thus obtained. The formed composite fluororesin film had a thickness of 30 μm and was transparent.

Referring to FIG. 5, the composite fluororesin film fabricated in the above was placed on metal plate 501 that is the copper plate, and piezoelectric treatment was performed from above the nonporous PFA layer at a high voltage of −8 kV for 90 seconds by using high voltage power supply (corona discharge device) 503 arranged such that a distance between the composite fluororesin film and the titanium needle tip was 8 mm from above the PFA layer. As a result, electric charges were trapped in the composite fluororesin film, and the piezoelectric element was thus obtained. Table 2 shows the result obtained by measuring piezoelectric constant $d_{33}$ of the obtained piezoelectric element based on the aforementioned measurement method.

TABLE 1

| stretched porous PTFE film No. | pore size (μm) | | | | film thickness (μm) | porosity (%) | piezoelectric constant $d_{33}$ (pC/N) | heating and pressure bonding treatment |
|---|---|---|---|---|---|---|---|---|
| | average of top 50 pores | | average of all pores | | | | | |
| | $A_{50}$ | $B_{50}$ | $A_{all}$ | $B_{all}$ | | | | |
| 1 | 2.13 | 6.86 | 0.29 | 0.83 | 60 | 61 | 54 | — |
| 2 | 4.76 | 13.42 | 0.42 | 1.11 | 77 | 73 | 17 | — |
| 3 | 5.95 | 14.43 | 0.42 | 1.16 | 98 | 73 | 18 | — |
| 4 | 7.17 | 14.13 | 0.44 | 1.09 | 100 | 79 | 20 | — |
| 5 | 6.51 | 21.51 | 0.45 | 0.96 | 70 | 78 | 19 | — |
| 6 | 3.72 | 15.15 | 0.36 | 1.10 | 50 | 80 | 44 | — |
| 7 | 4.03 | 5.06 | 0.40 | 0.54 | 82 | 82 | 36 | — |
| 8 | 2.28 | 4.19 | 0.37 | 0.54 | 31 | 60 | 68 | — |
| 9 | 2.91 | 6.54 | 0.44 | 0.77 | 30 | 66 | 60 | — |
| 10 | 2.37 | 4.50 | 0.42 | 0.62 | 15 | 37 | 79 | compress No. 8 at room temperature for 60 minutes |
| 11 | 2.60 | 5.93 | 0.41 | 0.66 | 14 | 54 | 52 | compress No. 9 at room temperature for 60 minutes |
| 12 | 1.90 | 6.99 | 0.37 | 0.98 | 19 | 30 | 75 | compress No. 7 at 130° C. for 20 minutes |
| 13 | 1.45 | 4.94 | 0.36 | 0.75 | 12 | 31 | 94 | compress No. 8 at 130° C. for 20 minutes |
| 14 | 1.70 | 3.91 | 0.44 | 0.78 | 12 | 35 | 97 | compress No. 9 at 130° C. for 20 minutes |
| 15 | 2.74 | 7.44 | 0.43 | 0.99 | 24 | 21 | 65 | compress No. 3 at 130° C. for 20 minutes |

As can be seen from FIG. 7(a), in the graph whose horizontal axis indicates average value $A_{50}$ of the thickness-direction lengths based on the top 50 pores averaging method and vertical axis indicates piezoelectric constant $d_{33}$, a high correlation (correlation coefficient: −0.90) was seen, whereas a special correlation was not seen between average value $A_{all}$ of the thickness-direction lengths based on the all pores averaging method and piezoelectric constant $d_{33}$ (in FIG. 7(b), correlation coefficient: −0.26). Therefore, it turns out that, in order to obtain high piezoelectricity in the porous fluororesin film, it is effective to use the porous fluororesin film in which the average value of thickness-direction lengths a obtained for the prescribed number of pores from the maximum value is small, and specifically the porous fluororesin film in which the average value (in Examples, $A_{50}$) of the top 50 pores is 3 μm or smaller.

Example 2

A composite fluororesin film having a nonporous FEP layer stacked on a stretched porous PTFE film was obtained similarly to Example 1, except that an FEP (FEP120JR manufactured by Du Pont-Mitsui Fluorochemicals Company, Ltd.) dispersion was used instead of the PFA dispersion used in Example 1. The obtained composite fluororesin film had a thickness of 30 μm and was transparent.

Similarly to Example 1, this composite fluororesin film was subjected to piezoelectric treatment by corona discharge treatment, and piezoelectric constant $d_{33}$ was measured. The result is shown in Table 2.

For reference, the results obtained from the stretched porous PTFE films No. 8 and No. 13 alone are also shown in Table 2 as Reference Examples 1 and 2, respectively.

TABLE 2

|  | stretched porous PTFE film | | | nonporous fluororesin layer type | composite fluororesin film thickness (μm) | evaluation | |
|---|---|---|---|---|---|---|---|
|  | thickness (μm) | $A_{50}$ (μm) | porosity (%) | | | piezoelectric constant $d_{33}$ (pC/N) | transparency (total light beam transmittance) (%) |
| Example 1 | 12 | 1.45 | 31 | PFA | 30 | 121 | 95 |
| Example 2 | 12 | 1.45 | 31 | FEP | 30 | 180 | 94 |
| Reference Example 1 | 31 | 2.28 | 60 | — | — | 68 | — |
| Reference Example 2 | 12 | 1.45 | 31 | — | — | 94 | — |

PFA: tetrafluoroethylene-perfluoroalkyl vinyl ether copolymer
FEP: tetrafluoroethylene-hexafluoropropylene copolymer
Reference Example 2: obtained by heating and compressing the stretched porous PTFE film in Reference Example 1

As can be seen from Table 2, the piezoelectric element including the composite fluororesin film (each of Examples 1 and 2) had more excellent piezoelectricity than that of the piezoelectric element including the stretched porous PTFE film alone (Reference Example 2). In addition, the piezoelectric element including the composite fluororesin film had more excellent piezoelectricity than that of the piezoelectric element including the stretched porous PTFE film alone that had the same level of thickness (Reference Example 1).

Furthermore, the stretched porous PTFE film alone was opaque, whereas the piezoelectric element including the composite fluororesin film (each of Examples 1 and 2) was transparent. This is probably due to surface smoothing, and further, this is probably because the fluororesin (the second fluororesin) for the nonporous fluororesin layer was impregnated into the pore portions at the interface between the stretched porous PTFE film and the nonporous fluororesin layer.

INDUSTRIAL APPLICABILITY

The piezoelectric element of the present invention has higher piezoelectricity than that of the piezoelectric element including the porous fluororesin film alone, without impairing the original excellent properties (heat resistance and chemical resistance) of the fluororesin film and the flexibility as the plastic film. Therefore, the piezoelectric element of the present invention can be used not only in the field of a piezoelectric element made of porous polyolefin, but also in the field where use of the piezoelectric element made of porous polyolefin was impossible and heat resistance and chemical resistance are required.

REFERENCE SIGNS LIST 1, 1' porous fluororesin film; 2, 2', 2'' nonporous fluororesin layer; 10 pore image; 11 sample film; 12 gold; 13 laser Doppler vibrating device; 20 pore; 501 metal plate; 502 composite fluororesin film; 503 high voltage power supply; 504 ammeter.

The invention claimed is:

1. A piezoelectric element, comprising: a porous fluororesin film made of a first fluororesin; and a nonporous fluororesin layer stacked on at least one surface of said porous fluororesin film and made of a second fluororesin, wherein
    said first fluororesin is different in type from said second fluororesin, and
    when 50 pores are selected in descending order from a pore having the longest thickness-direction length, of pores present in a cut surface of said porous fluororesin film in a thickness direction, an average value $A_{50}$ of thickness-direction lengths of the 50 pores is 3 μm or smaller.
2. The piezoelectric element according to claim 1, wherein a porosity of said porous fluororesin film is 10 to 40%.
3. The piezoelectric element according to claim 1, wherein said porous fluororesin film is a stretched porous polytetrafluoroethylene film.
4. The piezoelectric element according to claim 3, wherein said second fluororesin is tetrafluoroethylene-hexafluoropropylene copolymer or tetrafluoroethylene-perfluoroalkyl vinyl ether copolymer.
5. The piezoelectric element according to claim 1, wherein a thickness of said porous fluororesin film is 5 to 80 μm.
6. The piezoelectric element according to claim 1, wherein said porous fluororesin film is formed by compression in the thickness direction under heating.
7. The piezoelectric element according to claim 1, wherein the piezoelectric element is formed by superimposing a film obtained by drying a dispersion liquid of said second fluororesin and said porous fluororesin film on each other, and thereafter, heating the films to join and integrate the films.
8. The piezoelectric element according to claim 1, comprising said porous fluororesin film and said nonporous fluororesin layers stacked on both surfaces of said porous fluororesin film.
9. The piezoelectric element according to claim 1, wherein a total light beam transmittance is 90% or higher.
10. A sensor including the piezoelectric element as recited in claim 1.
11. A piezoelectric element mounting substrate, including the piezoelectric element as recited in claim 1 and a substrate having an electrode terminal, wherein said piezoelectric element and said electrode terminal are connected by solder having a melting point of 150° C. or lower or an electrically conductive adhesive.

* * * * *